(12) United States Patent
Cruz-Albrecht

(10) Patent No.: US 6,552,588 B1
(45) Date of Patent: Apr. 22, 2003

(54) METHOD AND APPARATUS TO GENERATE PSEUDO-RANDOM NON-PERIODIC DIGITAL SEQUENCES

(75) Inventor: Jose M. Cruz-Albrecht, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/972,140

(22) Filed: Oct. 5, 2001

(51) Int. Cl.[7] .................................................. H03K 5/01

(52) U.S. Cl. ........................................ 327/164; 327/166

(58) Field of Search .............................. 327/164, 166, 327/299, 105, 107, 124, 176, 175, 365; 370/515; 380/268

(56) References Cited

U.S. PATENT DOCUMENTS

| | | | | |
|---|---|---|---|---|
| 3,914,740 A | * | 10/1975 | Han ............................. 375/367 |
| 6,331,974 B1 | * | 12/2001 | Yang et al. ................... 370/342 |
| 6,356,602 B1 | * | 3/2002 | Rodal et al. .................. 375/344 |
| 6,396,355 B1 | * | 5/2002 | Rezin ........................... 327/156 |
| 6,404,260 B1 | * | 6/2002 | Cruz-Albrecht ............. 327/218 |

* cited by examiner

Primary Examiner—Timothy P. Callahan
Assistant Examiner—Linh Nguyen
(74) Attorney, Agent, or Firm—Park, Vaughan & Fleming LLP

(57) ABSTRACT

One embodiment of the present invention provides a system for generating a pseudo-random non-periodic digital sequence. The system operates by receiving a non-periodic signal at a data input of a flip-flop. This non-periodic signal is sampled at the flip-flop with a clock signal, thereby producing the pseudo-random non-periodic digital sequence at the output of the flip-flop.

18 Claims, 5 Drawing Sheets

METHOD AND APPARATUS TO GENERATE PSEUDO-RANDOM NON-PERIODIC DIGITAL SEQUENCES

RELATED APPLICATION

The subject matter of this application is related to the subject matter in a co-pending non-provisional application by the same inventor as the instant application entitled, "Method and Apparatus for Using a Non-Periodic Signal to Perform Clock Dithering," having Ser. No. 09/783,800, and filing date Feb. 13, 2001.

BACKGROUND

1. Field of the Invention

The present invention relates to generating pseudo-random digital sequences. More specifically, the present invention relates to a method and an apparatus to facilitate generating pseudo-random digital sequences that are non-periodic.

2. Related Art

Random digital sequences are useful for many purposes. Among these are statistical simulation, electronic hardware testing, communication link testing, cryptography, and the like. In practice, truly random digital sequences are difficult or nearly impossible to generate. Therefore, pseudo-random digital sequences are typically employed in place of the random digital sequences.

Pseudo-random digital sequences can be generated in many ways. Digital hardware can generate a pseudo-random digital sequence using such devices as feedback shift-registers, and many computer algorithms have been developed to generate pseudo-random numbers (digital sequences) within computer software.

Ideally, these pseudo-random digital sequence generators should not repeat the same sequence. However, since both digital hardware and computer algorithms are typically deterministic, the same sequence will eventually repeat after some finite period. Note that many techniques have been developed, both in hardware and software, to extend this period before the sequence will repeat and thus the sequence length, but nevertheless the sequence will eventually repeat.

When these pseudo-random digital sequences repeat, their usefulness for statistical simulation and testing is limited because replaying the same sequence may produce the same result as obtained previously. Additionally, a pattern that is not included in the sequence might yield new, and unexpected, results if it is included. Moreover, repeating the same pseudo-random digital sequence in a cryptographic system can present a vulnerability that can be exploited by an opponent.

What is needed is a method and an apparatus for generating pseudo-random digital sequences that does not repeat the same sequence after a finite period.

SUMMARY

One embodiment of the present invention provides a system for generating a pseudo-random non-periodic digital sequence. The system operates by first receiving a non-periodic signal at a data input of a flip-flop. This non-periodic signal is sampled at the flip-flop with a clock signal, thereby producing the pseudo-random non-periodic digital sequence at the output of the flip-flop.

In one embodiment of the present invention, the non-periodic signal is generated by using a chaotic circuit containing three or more energy storage elements.

In one embodiment of the present invention, the chaotic circuit includes a non-linear resistance element.

In one embodiment of the present invention, the system processes the non-periodic signal from the chaotic circuit using a comparator, thereby removing an oscillating signal superimposed on the non-periodic signal.

In one embodiment of the present invention, the system samples the non-periodic signal on a rising edge of the clock signal and on a falling edge of the clock signal.

In one embodiment of the present invention, the average frequency of the non-periodic signal is greater than three times the frequency of the clock signal.

In one embodiment of the present invention, the system creates the clock signal with a programmable frequency synthesizer.

In one embodiment of the present invention, the system provides parallel pseudo-random non-periodic digital sequences originating from multiple flip-flops to a parallel-to-serial converter. This parallel-to-serial converter converts the parallel pseudo-random non-periodic digital sequences into a serial sequence at a rate that depends on the number of flip-flops. Note that the input from each flip-flop is serialized before the output of the flip-flops change. Thus, the above-described embodiment provides a second pseudo-random non-periodic digital sequence that is faster than the parallel pseudo-random non-periodic digital sequence.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Circuit for Generating Pseudo-random Non-periodic Digital Sequences

Figure 1A:
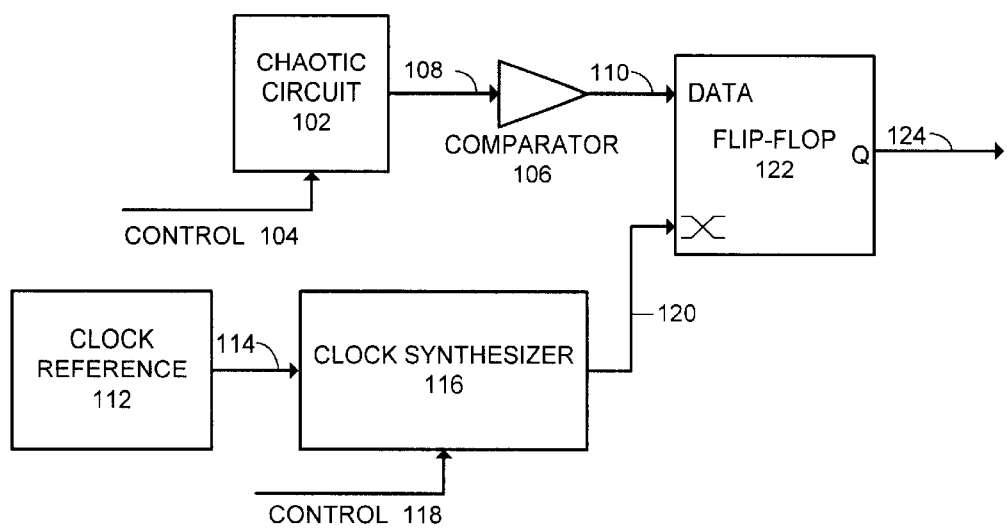
FIG. 1A illustrates a circuit for generating a pseudo-random non-periodic digital sequence in accordance with an embodiment of the present invention.

FIG. 1A illustrates a circuit for generating a pseudo-random non-periodic digital sequence in accordance with an embodiment of the present invention. This circuit includes chaotic circuit 102, comparator 106, clock reference 112, clock synthesizer 116, and flip-flop 122.

Chaotic circuit 102 generates chaotic signal 108 as described below in conjunction with FIG. 2. Control 104 controls the operation of chaotic circuit 102. Note that chaotic signal 108 periodically switches between oscillating around a high voltage value and oscillating around a low voltage value. Comparator 106 removes these oscillations and ensures that non-periodic signal 110 moves from rail to rail.

Clock reference 112 provides reference clock signal 114 to clock synthesizer 116. Clock synthesizer 116 generates clock signal 120, which switches at a multiple of the frequency of reference clock signal 114. Control 118 controls the operation of clock synthesizer 116 and sets the frequency of clock signal 120.

Flip-flop 122 receives clock signal 120 on its clock input. Flip-flop 122 is implemented such that the data input, non-periodic signal 110, is sampled on both the rising and the falling edges of clock signal 120. The Q output of flip-flop 122 produces the pseudo-random non-periodic digital sequence, which is labeled as signal 124.

Figure 1B:
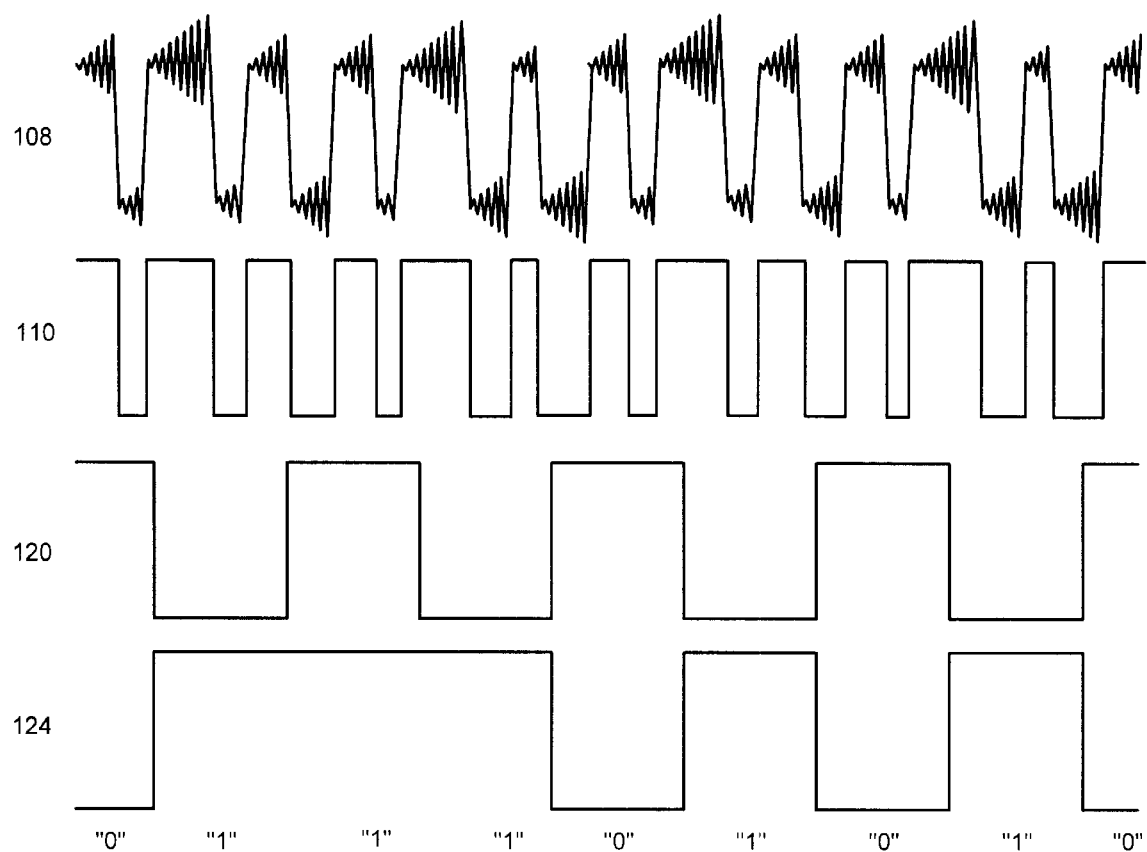
FIG. 1B is a timing diagram illustrating operation of the circuit in FIG. 1A in accordance with an embodiment of the present invention.

FIG. 1B is a timing diagram illustrating operation of the circuit illustrated in FIG. 1A in accordance with an embodiment of the present invention. Chaotic signal 108 is a typical output signal from chaotic circuit 102. As described below in conjunction with FIG. 2, chaotic signal 108 tends to periodically switch between oscillating around a high voltage value and oscillating around a low voltage value. A typical frequency for this oscillation is 2.5 gigahertz, giving a cycle time of 400 picoseconds.

Chaotic signal 108 switches between oscillating around a high voltage value and oscillating around a low voltage value at a variable time interval. However, control 104 can be used to set the average time interval. For example, control 104 can be set to provide an average frequency for chaotic signal 108 of 500 megahertz. This provides an average cycle time for chaotic signal 108 of two nanoseconds. However, because of the chaotic nature of chaotic circuit 102, the cycle time for chaotic signal 108 will vary between approximately one nanosecond and three nanoseconds.

Comparator 106 removes the oscillation around the high voltage value and the low voltage value on chaotic signal 108, thereby leaving non-periodic signal 110. Note that non-periodic signal 110 retains the basic timing characteristics of chaotic signal 108, but with the oscillation removed. Furthermore, non-periodic signal 110 moves from rail to rail, which produces a well-defined signal to the data input of flip-flop 122.

Clock synthesizer 116 provides clock signal 120 to the clock input of flip-flop 122. The frequency of clock signal 120 is a multiple of the frequency of reference clock signal 114 and is set by control 118. Typically, clock synthesizer 116 provides a 100-megahertz signal to flip-flop 122. The cycle time of clock signal 120 is, therefore, ten nanoseconds. Note that clock signal 120 typically has a cycle time of about five times the average cycle time of non-periodic signal 110. This disparity in cycle times provides an unpredictable value at the data input of flip-flop 122 when clock signal 120 changes state.

Flip-flop 122 samples the state of non-periodic signal 110 on both the rising and the falling edges of clock signal 120, thereby providing a 200-megahertz signal at the Q output of flip-flop 122. Each five-nanosecond period in signal 124 provides a high logic level or a low logic level depending on the state of non-periodic signal 110. The high-value and low-value periods can be equated to a 1 or a 0 value respectively in the pseudo-random non-periodic digital sequence. Since the state of non-periodic signal 110 is unpredictable at the sample time, the sequence of values on signal 124 is random, and will not repeat after any finite number of values have been delivered.

Circuit that Generates a Chaotic Signal

Figure 2:
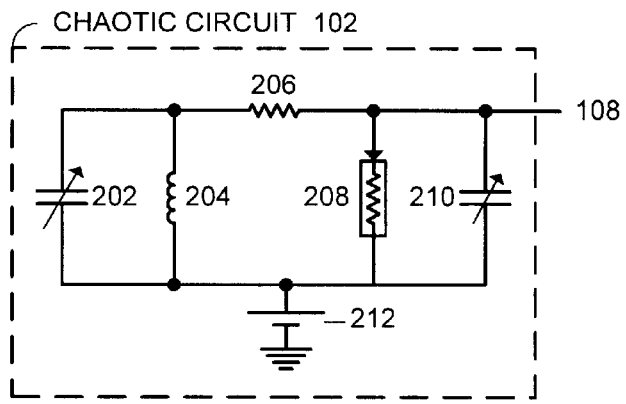
FIG. 2 illustrates a chaotic circuit 102 that produces a chaotic signal 108 in accordance with an embodiment of the present invention.

FIG. 2 illustrates a chaotic circuit 102 that produces a chaotic signal 108 in accordance with an embodiment of the present invention. Chaotic circuit 102 includes a number of circuit elements, including voltage-controlled capacitor (varactor) 202, inductor 204, resistor 206, non-linear resistor 208, varactor 210, and voltage source 212. The chaotic behavior of the chaotic circuit 102 illustrated in FIG. 2 has been analyzed (see "Sights and Sounds of Chaos," by Leon O. Chua and Rabinder N. Madan, IEEE Circuits and Devices Magazine, January 1988, pp. 3–13.) The chaotic signal 108 tends to switch between oscillating around a high voltage value and oscillating around a low voltage value (see chaotic signal 108 in FIG. 1B). However, the period between the switches is chaotic. Voltage source 212 biases chaotic signal 108 so that chaotic signal 108 switches between values approximately one volt above and one volt below the voltage of voltage source 212. Typically, voltage source 212 is set to Vdd/2 or one-half of the supply voltage.

Note that the circuit illustrated in FIG. 2 includes three energy storage elements (varactor 202, inductor 204 and varactor 210), which is the minimum number of energy storage elements required to produce a chaotic signal. In one embodiment of the present invention, control 104 sets the capacitance value of the varactors. Also note that in general any known circuit that generates a non-periodic signal can be used. Hence, the present invention is not meant to be limited to the circuit illustrated in FIG. 2.

Figure 3:
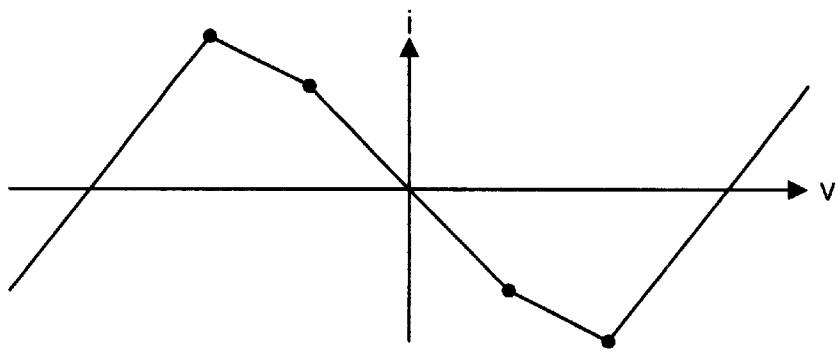
FIG. 3 illustrates the voltage-current characteristic of non-linear resistor 208 in accordance with an embodiment of the present invention.

FIG. 3 illustrates the voltage-current characteristic of non-linear resistor 208 in accordance with an embodiment of the present invention. Note that non-linear resistor 208 can be fabricated using two op amps, an op amp and two diodes, or two transistors and two diodes.

Comparator

Figure 4:
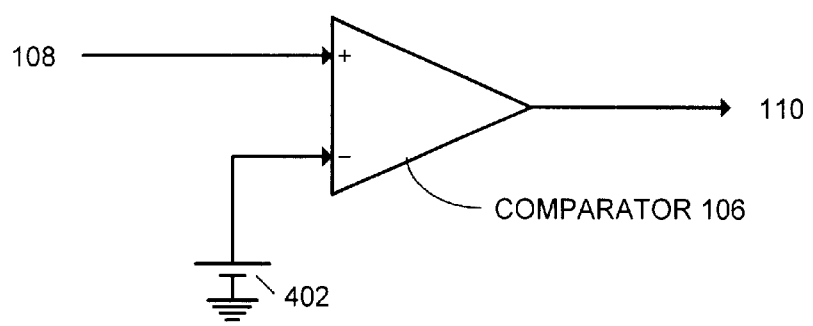
FIG. 4 illustrates comparator 106 in accordance with an embodiment of the present invention.

FIG. 4 illustrates comparator 106 in accordance with an embodiment of the present invention. Comparator 106 compares chaotic signal 108 at the positive input to the voltage from voltage source 402 at the negative input. Typically, voltage source 402 is set to Vdd/2 or one-half of the supply voltage. When chaotic signal 108 is more positive than voltage source 402, non-periodic signal 110 is positive. On the other hand, when chaotic signal 108 is more negative than voltage source 402, non-periodic signal 110 is negative.

Clock Synthesizer

Figure 5:
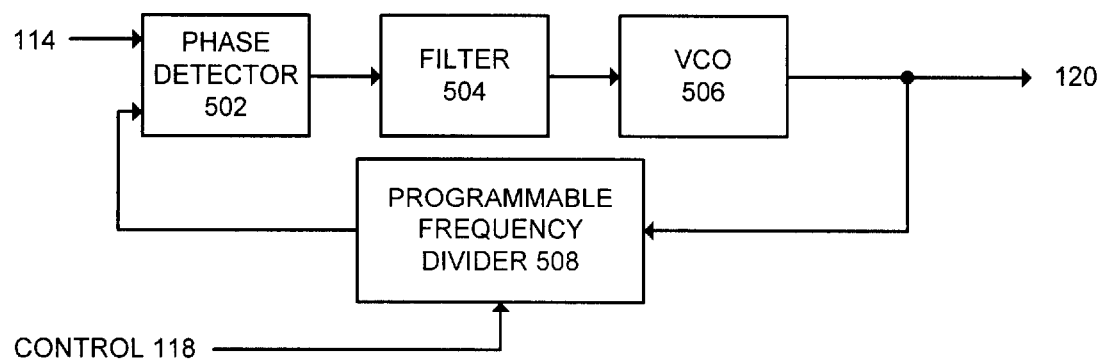
FIG. 5 illustrates clock synthesizer 116 in accordance with an embodiment of the present invention.

FIG. 5 illustrates clock synthesizer 116 in accordance with an embodiment of the present invention. Clock synthesizer 116 includes phase detector 502, filter 504, VCO 506, and programmable frequency divider 508. In operation, VCO 506 generates clock signal 120 based upon the input voltage from filter 504. Programmable frequency divider 508 divides this frequency at a ratio set by control 118. Phase detector 502 compares this divided clock frequency with reference clock signal 114 and produces a voltage output dependent upon the frequency difference and, ultimately, the phase difference between these two signals. This voltage output is filtered by filter 504 and applied to VCO 506 to control the frequency of VCO 506. Note that the circuit locks clock signal 120 to a multiple of reference clock signal 114, and thereby provides a stable clock frequency to flip flop 122.

Providing Higher Frequency Pseudo-random Streams

Figure 6A:
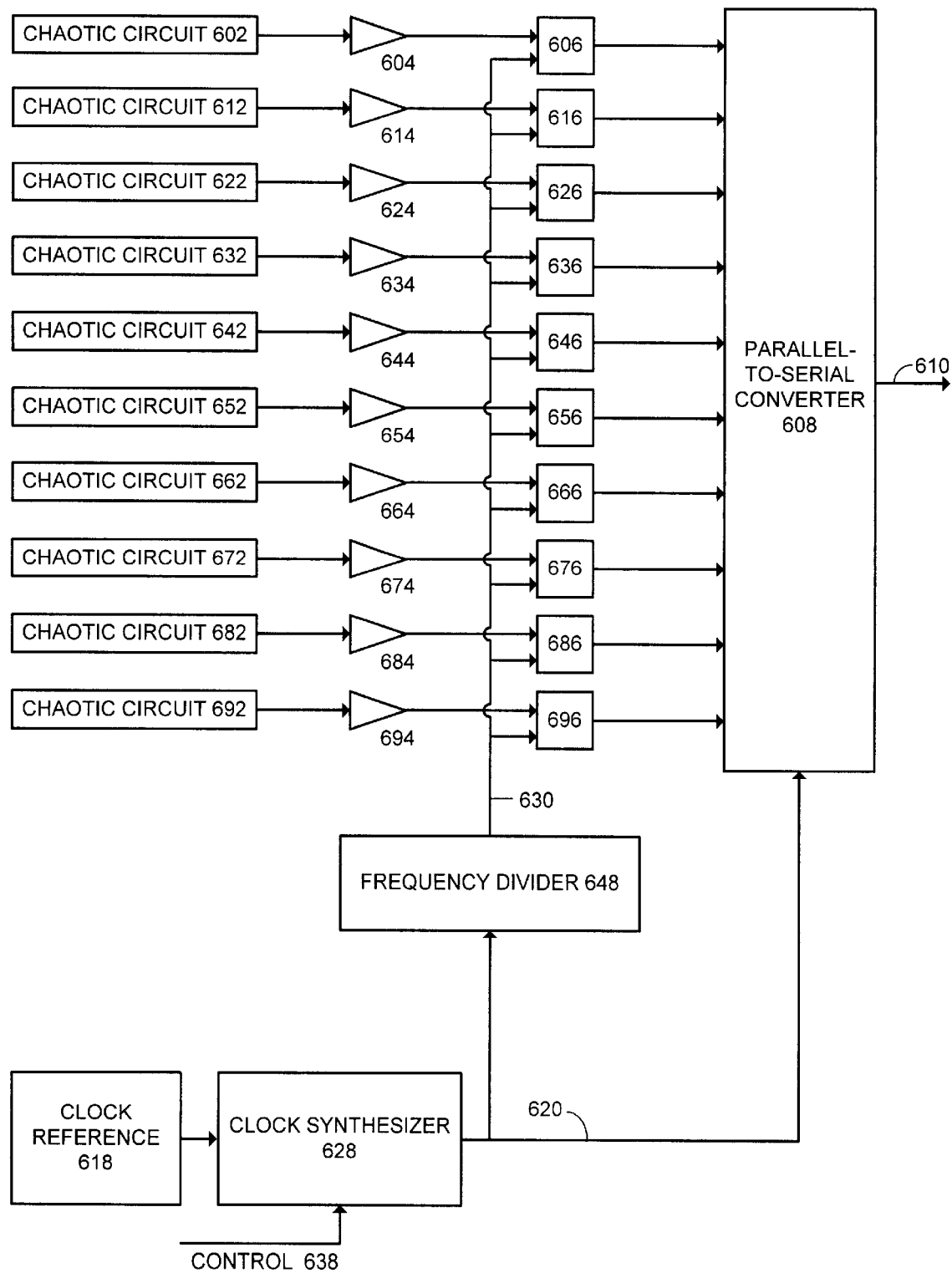
FIG. 6A illustrates multiple pseudo-random non-periodic digital sequence generators coupled to a parallel-to-serial converter in accordance with an embodiment of the present invention.

FIG. 6A illustrates multiple pseudo-random non-periodic digital sequence generators coupled to a parallel-to-serial converter in accordance with an embodiment of the present invention. Coupling the multiple sequence generators to the parallel-to-serial converter in this fashion acts to create a higher frequency pseudo-random digital sequence.

In this configuration, there are ten pseudo-random non-periodic signal generators, each as described above in conjunction with FIGS. 1–5. Note that the ten signal generators are being used as an example and that the exact number of generators can be more or less than ten depending on the desired output. The pseudo-random non-periodic signal generators include chaotic circuits 602, 612, 622, 632, 642, 652, 662, 672, 682, 692, comparators 604, 614, 624, 634, 644, 654, 664, 674, 684, 694, and flip-flops 606, 616, 626, 636, 646, 656, 666, 676, 686, 696. Flip-flops 606, 616, 626, 636, 646, 656, 666, 676, 686, 696 sample the outputs of comparators 604, 614, 624, 634, 644, 654, 664, 674, 684, and 694, respectively, on both the rising and the falling edges of clock signal 630 and supply their respective outputs to parallel-to-serial converter 608.

Clock reference 618, clock synthesizer 628, and control 638 operate as described above for clock reference 112, clock synthesizer 116, and control 118 respectively. The output of clock synthesizer 628—clock signal 620—is higher in frequency by a factor depending on the number of pseudo-random non-periodic signal generators, which are included in the circuit. In this example, the frequency of clock signal 620 is ten times the frequency of clock signal 120. Frequency divider 648 divides clock signal 620 to provide clock signal 630. The division ratio of frequency divider 648 is selected to provide the same frequency for clock signal 630 as for clock signal 120. In this example, the division ratio is ten.

Clock signal 620 is applied to parallel-to-serial converter 608. Parallel-to-serial converter 608 sequentially samples the output of flip-flops 606, 616, 626, 636, 646, 656, 666, 676, 686, and 696. A different flip-flop is sampled on each edge of clock signal 620 so that the output of parallel-to-serial converter 608 includes a sequence of, in this case ten, pseudo-random non-periodic sequences. Since the sampling is on both edges of clock signal 620, the bit period of pseudo-random non-periodic sequence 610 is two times the period of clock signal 620.

Figure 6B:
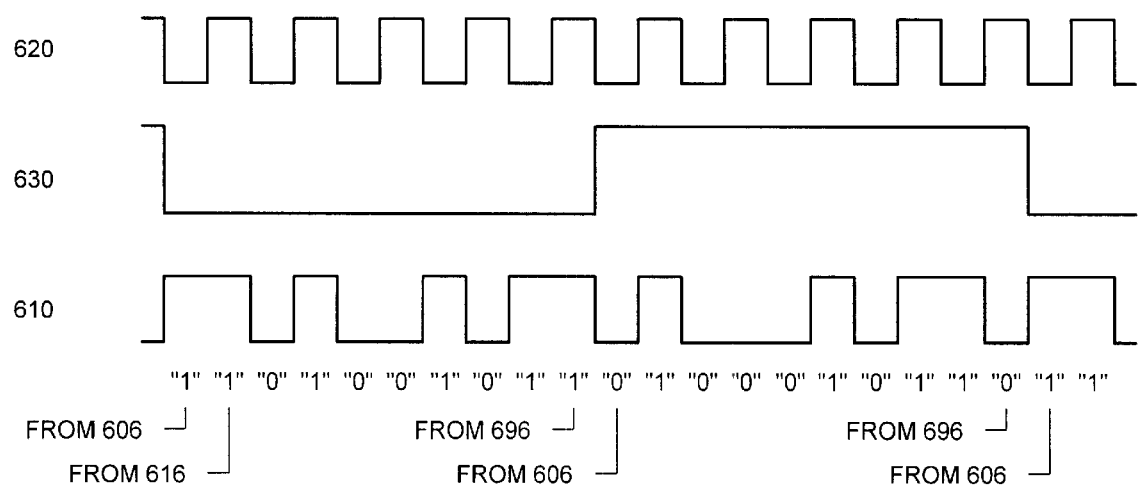
FIG. 6B is a timing diagram illustrating operation of the circuit in FIG. 6A in accordance with an embodiment of the present invention.

FIG. 6B is a timing diagram illustrating operation of the circuit in FIG. 6A in accordance with an embodiment of the present invention. Clock signal 620 from clock synthesizer 628 is N times the frequency of clock signal 630, where N is the number of pseudo-random non-periodic sequence generators included in the circuit. For example, when N=10 and the frequency of clock reference 618 is 100 megahertz, the frequency of clock signal 620 is 1 gigahertz. Frequency divider 648 divides the frequency of clock signal 620 by N to yield clock signal 630 at 100 megahertz.

Parallel-to-serial converter 608 samples an input sequence on both the rising and the falling edges of clock signal 620. Pseudo-random non-periodic sequence 610, therefore, is a stream of pseudo-random non-periodic bits at a 2-gigabit per second rate. The bit period is 0.5 nanoseconds.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for generating a pseudo-random non-periodic digital sequence, comprising;
   receiving a non-periodic signal at a data input of a flip-flop;
   sampling the non-periodic signal at the flip-flop with a clock signal, wherein sampling the non-periodic signal includes sampling the non-periodic signal on a rising edge of the clock signal and on a falling edge of the clock signal; and
   providing an output of the flip-flop as the pseudo-random non-periodic digital sequence.

2. The method of claim 1, further comprising generating the non-periodic signal by using a chaotic circuit containing three or more energy storage elements.

3. The method of claim 2, wherein the chaotic circuit includes a non-linear resistance element.

4. The method of claim 2, further comprising processing the non-periodic signal from the chaotic circuit using a comparator, thereby removing an oscillating signal superimposed on the non-periodic signal.

5. The method of claim 1, wherein an average frequency of the non-periodic signal is greater than three times a frequency of the clock signal.

6. The method of claim 1, further comprising creating the clock signal with a programmable frequency synthesizer.

7. The method of claim 1, further comprising:
   providing a parallel pseudo-random non-periodic digital sequence from a plurality of flip-flops to a parallel-to-serial converter; and
   converting the parallel pseudo-random non-periodic digital sequence from the plurality of flip-flops into a serial sequence at a rate dependent on a quantity of flip-flops in the plurality of flip-flops, whereby each flip-flop in the plurality of flip-flops is serialized before the output of the plurality of flip-flops changes, thus providing a second pseudo-random non-periodic digital sequence that is faster than the parallel pseudo-random non-periodic digital sequence.

8. An apparatus for generating a pseudo-random non-periodic digital sequence, comprising;
   a non-periodic signal generator;
   a comparator, including an input electrically coupled to the non-periodic signal generator, wherein a comparator output is a filtered non-periodic signal;
   a clock signal generator, wherein the clock signal generator generates a clock signal; and
   a flip-flop, wherein a data input of the flip-flop is the filtered non-periodic signal, a clock input of the flip-flop is the clock signal, and a flip-flop output is the pseudo-random non-periodic digital sequence, and wherein the flip-flop samples the data input on a rising edge of the clock input and on a falling edge of the clock input.

9. The apparatus of claim 8, wherein the non-periodic signal generator includes a chaotic circuit containing three or more energy storage elements.

10. The apparatus of claim 9, wherein the chaotic circuit includes a non-linear resistance element.

11. The apparatus of claim 9, wherein the comparator removes an oscillating signal superimposed on an output of the chaotic circuit.

12. The apparatus of claim 8, wherein the clock signal generator includes:
   a digital clock reference circuit; and
   a clock synthesizer coupled to the digital clock reference circuit.

13. The apparatus of claim 12, wherein the clock synthesizer is configured to be programmed to generate the clock signal at a multiple of a frequency of the digital clock reference circuit.

14. The apparatus of claim 8, wherein an average frequency of the filtered non-periodic signal is greater than three times a frequency of the clock signal.

15. The apparatus of claim 8, further comprising a parallel-to-serial converter, wherein the parallel-to-serial converter receives a plurality of non-periodic digital sequences and converts the plurality of non-periodic digital sequences into a serial sequence.

16. An apparatus that uses a non-periodic signal to generate a pseudo-random non-periodic digital sequence, comprising:
   a non-periodic signal generator;
   a comparator including an input electrically coupled to the non-periodic signal generator, wherein a comparator output is the non-periodic signal;
   a clock signal generator, wherein the clock signal generator generates a clock signal; and
   a flip-flop, wherein a data input of the flip-flop is the non-periodic signal, a clock input of the flip-flop is the clock signal, and a flip-flop output is the pseudo-random non-periodic digital sequence, and wherein the flip-flop samples the data input on a rising edge of the clock input and on a falling edge of the clock input.

17. The apparatus of claim 16, wherein the non-periodic signal generator includes a chaotic circuit containing three or more energy storage elements.

18. The apparatus of claim 16, further comprising a parallel-to-serial converter, wherein the parallel-to-serial converter receives a plurality of non-periodic digital sequences and converts the plurality of non-periodic digital sequences to a serial stream.

* * * * *